United States Patent [19]

Uda et al.

[11] Patent Number: 5,001,734
[45] Date of Patent: Mar. 19, 1991

[54] SOR EXPOSURE SYSTEM

[75] Inventors: Koji Uda; Yutaka Tanaka, both of Yokohama; Tetsuzo Mori, Atsugi; Isamu Shimoda, Zama; Shunichi Uzawa, Tokyo, all of Japan

[73] Assignee: Canon Kabushiki Kaisha, Tokyo, Japan

[21] Appl. No.: 401,791

[22] Filed: Sep. 1, 1989

[30] Foreign Application Priority Data

Sep. 5, 1988 [JP] Japan ................... 63-220488

[51] Int. Cl.$^5$ ............................................. G21K 5/00
[52] U.S. Cl. ...................................... 378/34; 378/35; 256/492.2
[58] Field of Search ................. 378/34, 35; 256/492.2

[56] References Cited

U.S. PATENT DOCUMENTS

| 4,748,646 | 5/1988 | Osada et al. | 378/34 |
| 4,788,698 | 11/1988 | Kimura et al. | 378/34 |
| 4,803,713 | 2/1989 | Fujii | 378/35 |

FOREIGN PATENT DOCUMENTS 1088400  4/1989  Japan ................... 378/206

OTHER PUBLICATIONS

H. Betz, "High Resolution Lithography Using Synchrotron Radiation," Elsevier Science Publishers, May, 1986, pp. 658 through 667.

Okada et al., "Development of Highly Reliable Synchrotron Radiation Lithography Beamline," J. Vac. Sci. Tech. B6(1), Jan./Feb. 1988, pp. 191-194.

Primary Examiner—Carolyn E. Fields
Assistant Examiner—David P. Porta
Attorney, Agent, or Firm—Fitzpatrick, Cella, Harper & Scinto

[57] ABSTRACT

Synchrotron orbital radiation (SOR) exposure system includes a SOR ring and a plurality of exposure apparatus each being coupled to the SOR ring and being arranged to expose a wafer to a mask pattern with X-rays contained in synchrotron radiation from the SOR ring to thereby print the mask pattern on the wafer. Specific arrangement is provided to allow communication of a control of the SOR ring and respective controls of the exposure apparatuses. If any abnormality such as vacuum leakage occurs in one exposure apparatus, the information is transmitted to all the controls to start, in all the exposure apparatuses, appropriate operations to protect the exposure apparatuses against the abnormality. This makes it possible to prevent stoppage of the SOR exposure system as a whole even when any abnormality occurs in one exposure apparatus.

10 Claims, 4 Drawing Sheets

SOR EXPOSURE SYSTEM

FIELD OF THE INVENTION AND RELATED ART

This invention relates to a synchrotron orbital radiation (SOR) exposure system. More particularly, the invention is concerned with such a SOR exposure system having a plurality of exposure apparatus each being adapted to expose a mask (photomask) and a semiconductor wafer with X-rays included in synchrotron radiation light emitted from a SOR ring, to thereby print a pattern of the mask on the semiconductor wafer, particularly for manufacture of semiconductor microcircuit devices.

A SOR exposure system for printing a pattern of a mask on a wafer by using X-rays contained in synchrotron radiation light from a SOR ring is known.

FIG. 1 shows an example of a known type SOR exposure system. Denoted in this Figure at 13 is a port through which SOR light is introduced from a SOR ring (not shown) to an exposure apparatus 15. The exposure apparatus 15 is arranged to hold a mask and a wafer in a predetermined positional relationship and to expose the wafer to the mask with radiation, i.e., the SOR light (X-rays), to print a pattern of the mask on the wafer. Between the port 13 and the exposure apparatus 15, there are provided, in an order along the advancement of the SOR light from the port 13, an emergency cut-off valve 17, a shock wave delay tube 18 and a mirror chamber 19. In front of the exposure apparatus 15, there is provided a beryllium window 20. The mirror chamber 19 accommodates therein an X-ray mirror arrangement for expanding the SOR light into an area-distributed light. The inside of the chamber is maintained at high vacuum. The beryllium window 20 is provided in order to isolate, in terms of pressure, the vacuum ambience within the mirror chamber 19 (where the exposure apparatus 15 is of the type wherein the exposure is made in an atmospheric pressure ambience or He gas ambience) and also for the purpose of providing a filter means for extracting only a wavelength or wavelengths, necessary for the exposure, out of the SOR light. The emergency cutoff valve 17 and the shock wave delay tube 18 serve to protect the super high vacuum at the SOR ring side, against any vacuum leakage from the mirror or exposure apparatus side.

SUMMARY OF THE INVENTION

The SOR exposure system of the type described above involves a problem that, if vacuum leakage occurs at the SOR side or port side including the mirror portion, the beryllium window attached to the exposure apparatus can not bear a differential pressure (atmospheric pressure and He pressure) and is broken to cause contamination of the exposure apparatus by pieces of the broken beryllium film, for example.

Additionally, where a plurality of exposure apparatuses are connected to a single SOR ring, there is a possibility that any abnormality in vacuum in the port of one exposure apparatus causes vacuum breakage of the SOR ring itself or linked or chained vacuum leakage in one or more other ports, resulting in contamination of these additional exposure apparatuses due to the breakage of their beryllium windows.

Accordingly, an object of the present invention is to avoid application of a differential pressure to a beryllium window even if vacuum breakage occurs in a port and also to prevent damages to the other exposure apparatuses.

In another aspect, in a SOR exposure system, a SOR ring, a mirror port and an exposure apparatus should be maintained in a correct positional relationship. This is particularly important between the mirror port and the exposure apparatus. Usually, such a positional relationship is set or, alternatively, is controlled with a predetermined tolerance. If, however, once the respective positions are shifted due to earthquake or the like, there occurs a problem of transfer distortion in printing the mask pattern on the wafer by exposure.

Accordingly, another object of the present invention is to provide an arrangement wherein any possibility of relative positional deviation of a SOR ring, a mirror port and an exposure apparatus can be detected by using a seismometer or the like and wherein, when an earthquake is detected, the exposure apparatus is stopped to thereby avoid unsatisfactory exposure.

In accordance with the present invention, to achieve at least one of these objects, a vacuum gauge is provided within a mirror chamber to measure the degree of vacuum in the mirror chamber and in a port portion. Also, on one side of a beryllium window, facing a light source (i.e. the mirror side thereof), an emergency cutoff valve is disposed. The emergency cutoff valve can be closed by the pressure in the mirror chamber, to thereby protect the beryllium window. In another aspect, if any abnormality in the degree of vacuum related to one port is detected, by using a communication means all the emergency cutoff valves of all the ports are closed and, on the other hand, information is supplied to the SOR ring and to all the other exposure apparatuses, starting necessary and predetermined protective operations. By this, any damage by the vacuum abnormality can be avoided. In a further aspect, with regard to any positional deviation of the SOR ring, mirror port and exposure apparatus, if any abnormality is detected by using a seismometer, through communication cables instructions are supplied to stop all the exposure apparatuses.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
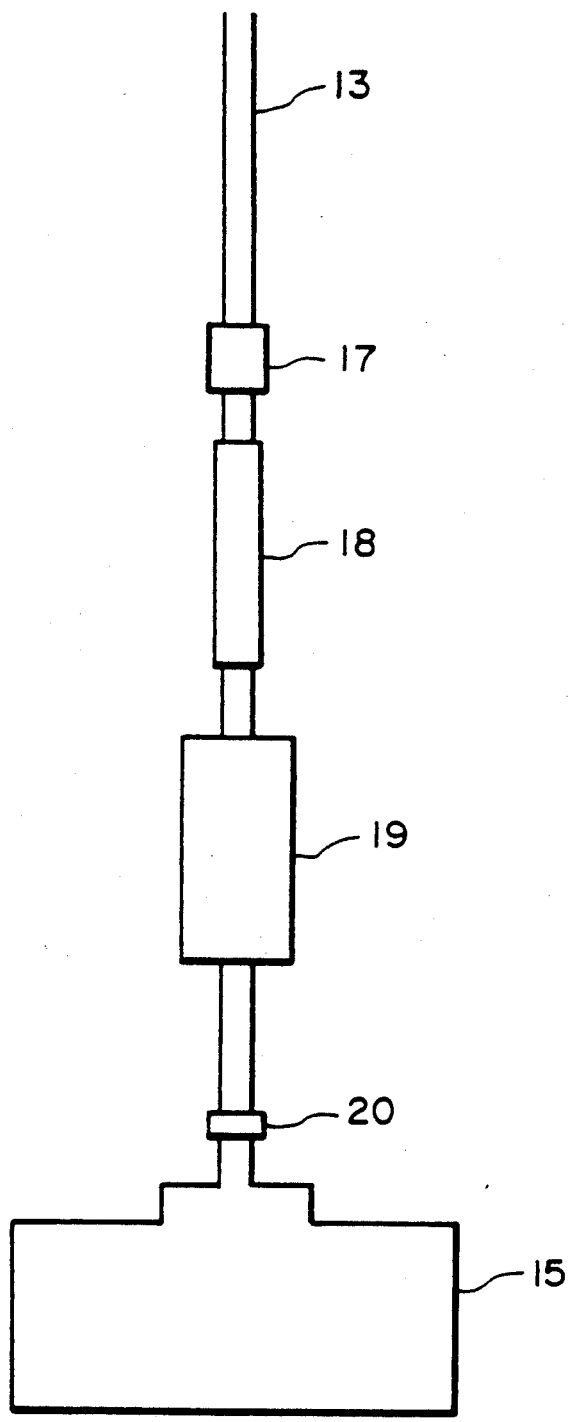
FIG. 1 is a partial and schematic view of a known type SOR exposure system.
Figure 2:
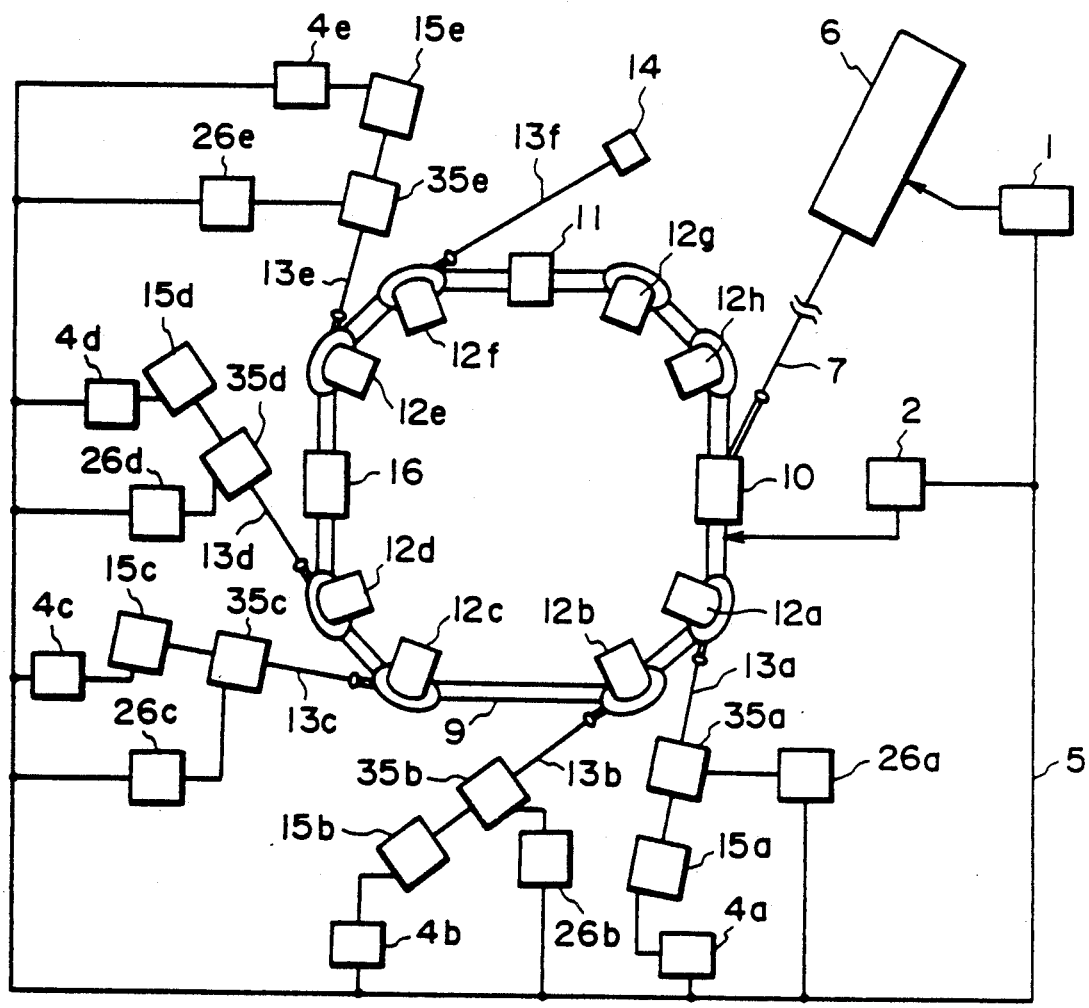
FIG. 2 is a schematic and diagrammatic view of a SOR exposure system according to an embodiment of the present invention.

Referring now to FIG. 2, there is shown a general structure of a SOR (or synchrotron radiation light) exposure system according to an embodiment of the present invention.

Denoted in FIG. 2 at 8 is a SOR ring for producing SOR light. Denoted at 6 is a linear accelerator (linear electron accelerator) for producing and accelerating an electron beam so that the energy of the electron beam is injected into the SOR ring 8. Denoted at 7 is a beam transportation passageway; at 13a-13f are ports each for picking up SOR light from the SOR ring 8; at 14 is a beam monitor for monitoring accumulated energy of the SOR ring 8 or for monitoring the quantity of the SOR light; and at 15a-15e are exposure apparatuses. Each of the exposure apparatuses 15a-15e is arranged to hold a mask and a semiconductor wafer within a desired reduced pressure ambience and in a predetermined correct positional relationship, and also it is arranged to control the exposure of the semiconductor wafer to the mask with the SOR light.

Denoted at 26a-26e are mirror port controls for controlling mirror ports 35a-35e, respectively. Each of the mirror ports 35a-35e is disposed between corresponding one of ports 13a-13e and corresponding one of the exposure apparatuses 15a-15e, for introducing the SOR light to the corresponding exposure apparatus, with the SOR light being adjusted by the mirror port to be suited for exposure by the exposure apparatus. Details of these mirror ports 35a-35e will be described later with reference to FIG. 3.

The SOR ring 8 comprises a beam input 10 which receives an electron beam from the linear accelerator 6, a ring-like super high vacuum vessel 9 through which the electron beam circulates, a vacuum pump (not shown) for evacuating the vessel 9, deflecting electromagnets 12a-12h for deflecting the electron beam, a kicker coil 16 for correcting the orbit of the electron beam when it is inputted and for correcting the orbit of the same in the steady state, a high frequency acceleration cavity 11 for accelerating the electron beam to maintain a constant speed thereof, thereby compensating the reduction in speed of the electron beam by one circulation thereof. At each of the sites at which the electron beam is deflected by the deflecting electromagnetic 12a-12h, SOR light is produced. Although the SOR ring 8 actually has a more complicated structure than the described, only major parts thereof are illustrated for convenience.

The SOR ring 8, the linear accelerator 6 and the exposure apparatuses 15a-15e are equipped with and controlled by controls 1, 2 and 4a-4e, respectively. The control 1 for the SOR ring 8, the control 2 for the linear accelerator 6 and the controls 4a-4e for the exposure apparatuses 15a-15e are connected in series by means of a communication cable 5, such that communication of information is attainable between the controls 4a-4e, between the controls 4a-4e and controls 1 and 2, and between the controls 1 and 2.

Figure 3:
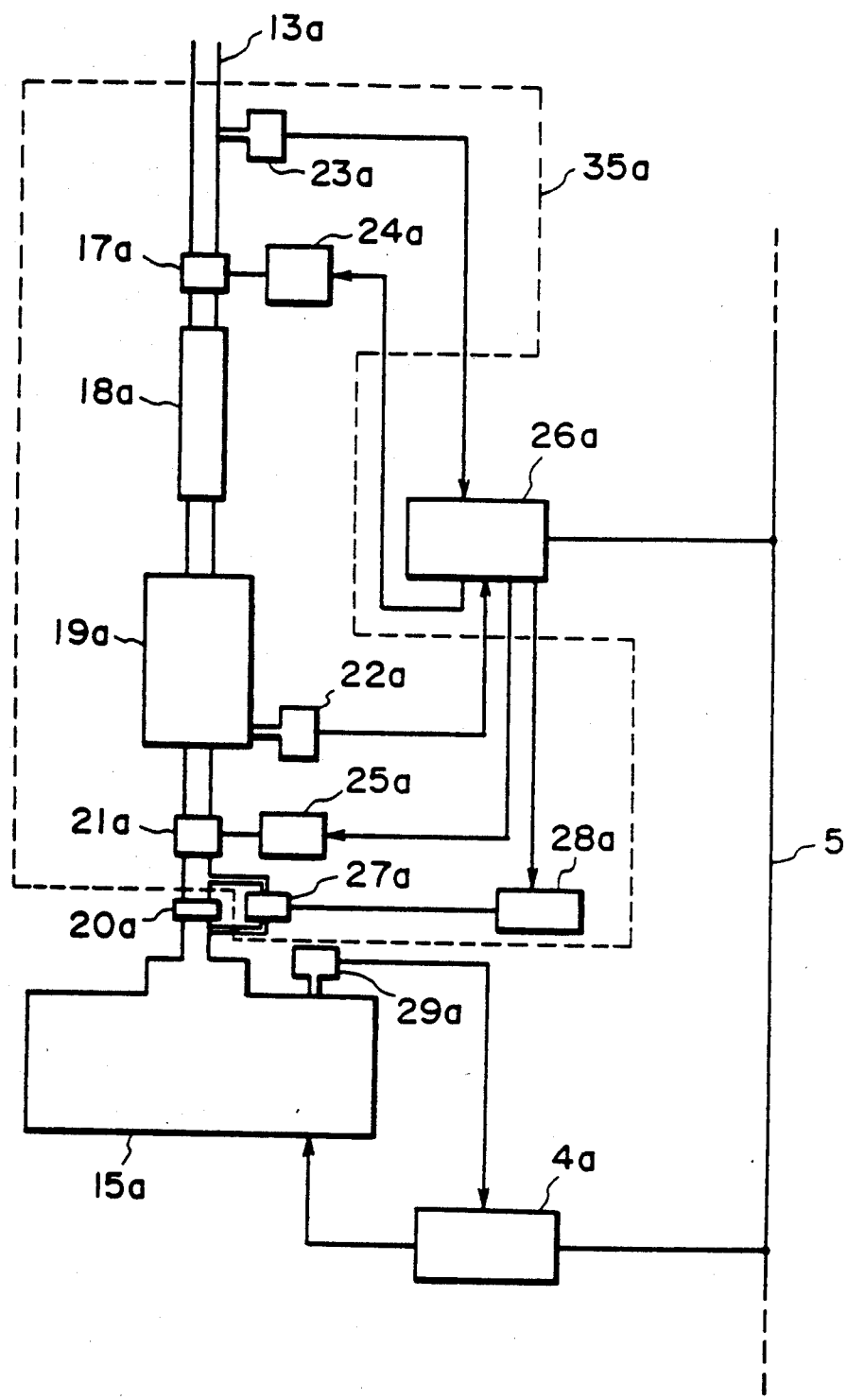
FIG. 3 is a schematic and diagrammatic view showing a major portion of the FIG. 2 embodiment.

FIG. 3 illustrates a part of the SOR exposure system of the FIG. 2 embodiment, including the elements from the port 13a to the exposure apparatus 15a. In FIG. 3, denoted at 21a is an emergency cutoff valve which is disposed on the mirror chamber 19a side and just before a beryllium window 20a; at 22a is a vacuum gauge for measuring the degree of vacuum within the mirror chamber 19a and in the beam line portion to the beryllium window 20a; and at 24a and 25a are actuators for driving the emergency cutoff valves 17a and 21a, respectively. Shock wave delay tube 18a is disposed between the emergency cutoff valve 17a and the mirror chamber 19a. When leakage occurs on one side of the delay tube 18a, the delay tube serves to retard transmission of the effect of such leakage to the other side. Denoted at 23a is a vacuum gauge for measuring the degree of vacuum in the port 13a. Denoted at 26a is a port control. The vacuum gauges 22a and 23a as well as the actuators 24a and 25a of the cutoff valves 17a and 21a are all connected to this port control 26a. Also, the port control 26a is in communication with the exposure apparatus control 4a through the communication cable 5. Each of the parts from the ports 13b-13e to the exposure apparatuses 15b-15e shown in FIG. 2 have the same structures as described above. The port control 26a is connected to the other port controls 26b-26e and exposure apparatus controls 4b-4e as well as the linear accelerator control 1 and the SOR ring control 2, through the communication cable 5 such that communication with one of these controls is possible. Denoted at 29a is a vacuum gauge for measuring the pressure within the body of the exposure apparatus 15a, which gauge is connected to the exposure apparatus control 4a. Denoted at 27a is a by-passing valve for communicating the opposite sides of the beryllium window 20a, and denoted at 28a is a driving circuit therefor which is connected to the port control 26a.

Referring to FIGS. 2 and 3, the operation of the apparatus of the present embodiment will now be explained. It is now assumed that the super high vacuum vessel 9 of the SOR ring 8 is maintained in a super high vacuum state such as of an order of $10^{-10}$ Torr, for example. If so, then vacuum is transmitted from the port 13 (this means each of the ports 13a-13e, and it is also the case with similar recitations to be made later) through the emergency cutoff valve 17 which is open and through the shock wave delay tube 18 to the mirror chamber 19, such that the mirror chamber is held in a vacuum state of an order of $10^{-8}$-$10^{-7}$ Torr, for example. While not illustrated in the drawings, the part from the port 13 to the mirror chamber 19 is evacuated by means of plural vacuum pumps. With regard to the part from the mirror chamber 19, whether a high vacuum is introduced to the front of the beryllium window 20 is determined in accordance with whether the emergency cutoff valve 21 is open or closed. These components are coupled in series by means of a pipeline, in an order of advancement of the SOR light from the SOR ring 8. While the pressure within the body of the exposure apparatus 15 is measured by the vacuum gauge 29, by using this pressure $V_C$ (normally it is retained at 150 Torr) and the pressure $V_{MR}$ in the mirror chamber 19 (normally it is of an order of $10^{-8}$-$10^{-7}$ Torr as described hereinbefore) as measured by the vacuum gauge 22 the port control 26 discriminates the differential pressure applied to the beryllium window 20 and actuates the driving device 28a so as to open/close the by-passing valve 27. More specifically, (1) where the inside of the mirror chamber 19 is at an atmospheric pressure for adjustment of the chamber 19 or for any other reason, and if $V_C$=150 Torr and $V_{MR}$=760 Torr, or, alternatively, (2) where the inside of the exposure apparatus 15 is at an atmospheric pressure for adjustment of the exposure apparatus or for any other reason and if $V_C$=760 Torr and $V_{MR}$=$10^{-8}$-$10^{-7}$ Torr, the emergency cutoff valve 21 is closed to prohibit the application of a differential pressure to the beryllium window 20 and, on the other hand, the bypassing valve 27 is opened, whereby the differential pressure is reduced to zero. For exposure of a wafer to a mask with the SOR light, in the exposure apparatus 15, both of the cutoff valves 17 and 21 are opened.

The above-described is the operation related to the cutoff valves 17 and 21 and the valve 27 in the normal state, including the exposure operation. If any abnormality occurs, the following operation will be made.

If, due to any damage of the vacuum vessel 9 or port 13, vacuum leakage to the atmosphere occurs in the SOR ring 8 or at the port 13 side, such leakage is detected by the vacuum gauge 23 attached to the port at the SOR ring side. Detection signal is transmitted to the port control 26 and, in response, the port control 26 actuates the driving device 25 to close the emergency cutoff valve 21. Here, the propagation of the impact wave caused by the leakage is retarded by means of the delay tube 18 and by the distance to the beryllium window 20, which is about 10 m, in a practical example. Thus, the closing operation of the cutoff valve 21 can precede the impact wave.

If, on the other hand, the vacuum leakage occurs at the exposure apparatus 15 side or the mirror chamber 19 side, due to any damage of a main chamber for providing a predetermined reduced pressure ambience in the exposure apparatus 15 or to any damage of the mirror chamber 19, such leakage is detected by the vacuum gauge 22 of the mirror chamber 19. Like the above-described case, in response to a detection signal from the gauge, the port control 26 actuates the driving device 28 to close the emergency cutoff valve 17 at the port side. Since the impact wave delay tube 18 has a retarding function in bi-direction, also in this case the closing operation can precede the impact wave.

As described hereinbefore, with respect to each of the SOR port side and the exposure apparatus side, the leakage can be intercepted by means of the emergency cutoff valves provided at two sites. Next, description will be made of mutual leakage protection of the plural exposure apparatuses 15a–15e coupled to the SOR ring 8.

As for the leakage at the port side, once the leakage at the port 13a, for example, is detected, namely, if the vacuum gauge 23a detects leakage, a signal therefrom is directly transmitted to the port controls 26a–26e through the communication cable 5, so that all the emergency cutoff valves 21a–21e at the exposure apparatus side are closed. Since in this case the leakage is at the SOR side, there is a high possibility that leakage abnormality occurs at every port. Therefore, the above-described operation assures higher certainty and reliability, than detecting leakage at each port independently of the others and operating the associated cutoff valve.

If the leakage occurs at the exposure apparatus side, such a port at which the leakage has occurred is isolated by the emergency cutoff valve 17. Simultaneously therewith, such information is transmitted through the communication cable 5 to each port control 26 to close the emergency cutoff valves 21a–21e of the respective exposure apparatuses. This ensures with certainty the protection of the beryllium window 21 and the exposure apparatus 15 even in the worst case wherein the leakage is not intercepted by the emergency cutoff valve 17.

Figure 4:
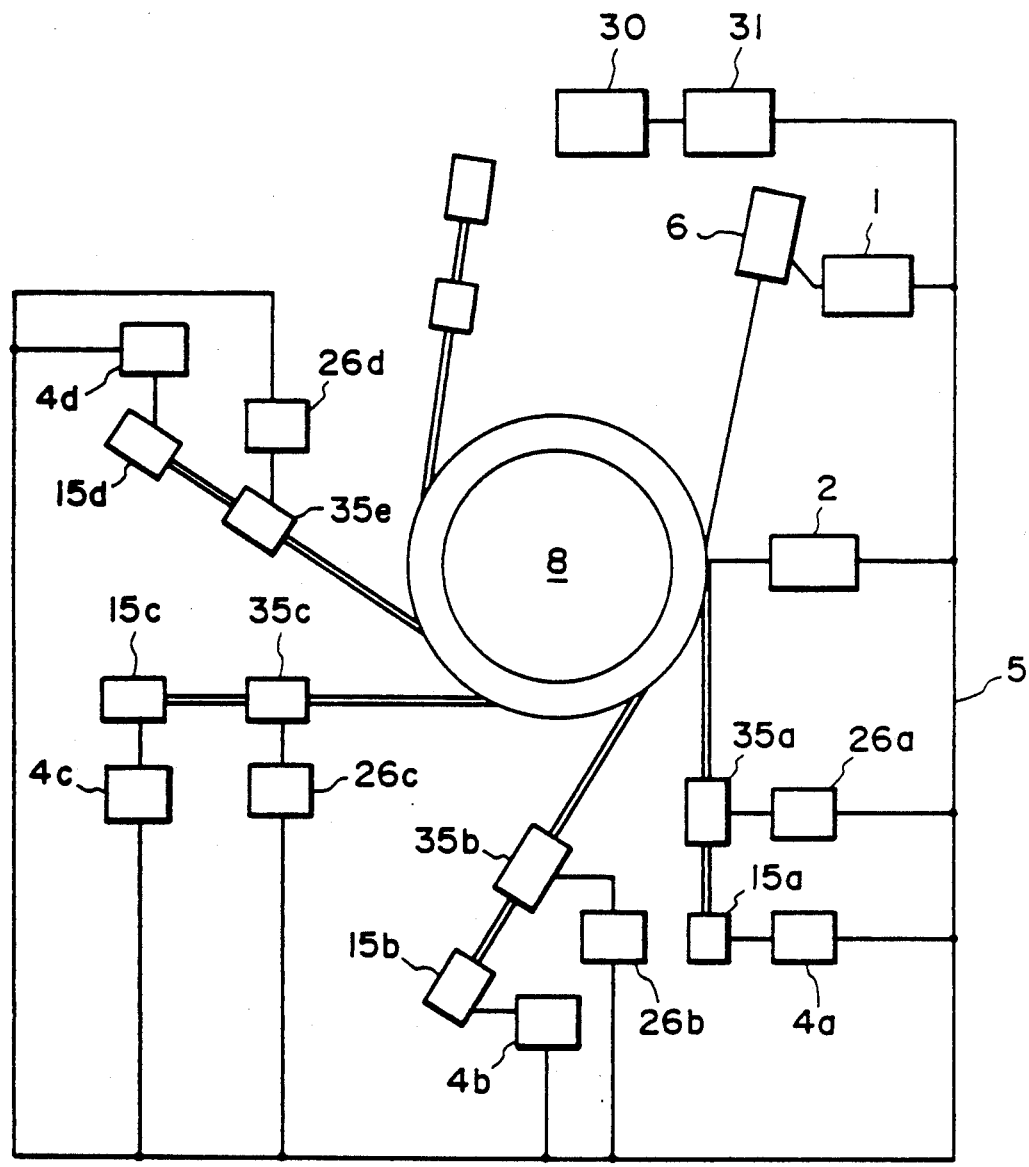
FIG. 4 is a schematic and diagrammatic view of a SOR exposure system according to another embodiment of the present invention.

FIG. 4 shows another embodiment wherein a signal from a seismometer is used as a signal representing the abnormality of the SOR exposure system. In FIG. 4, denoted at 30 is a seismometer which is placed on the same ground on which the SOR exposure system is provided. Denoted at 31 is a signal processing means which is operable to compare the signal from the seismometer 30 with a certain set value and also to provide, in a certain situation or situations, an alarm in the form of an abnormality signal. The signal processing means includes a communication control means for transmitting the abnormality signal to the communication cable 5.

When any abnormal vibration of the exposure system is detected, in the exposure system there is a possibility that the state of alignment between the exposure apparatus 15 and the mirror port portion 35, including the components from the port side emergency cutoff valve 17 to the exposure apparatus side emergency cutoff valve 21, is destroyed such that the irradiation range with the SOR light is relatively shifted to a mask and a wafer in the exposure apparatus 15. In consideration thereof, for a wafer which is being in the course of exposure, it is necessary to promptly stop the exposure. Accordingly, in response to reception of an abnormality signal from the earthquake signal processing means 31 through the communication cable 5, each exposure apparatus control 4 interrupts the exposure in the corresponding exposure apparatus 15. Resumption of the interrupted exposure operation is made after completion of a predetermined procedure for checking the state of alignment between the mirror port portion and the exposure apparatus. On the other hand, in response to reception of an abnormality signal from the seismometer 30, the linear accelerator control 1 and the SOR ring control 2 operate to stop the operation of the linear accelerator 6 and the SOR ring 8. Accordingly, the resumption of operation of this part will be made after completion of a predetermined inspecting procedure. While the communication cable 5 may comprise a single communication line, it may comprise plural communication lines one of which may be used exclusively for an abnormality signal.

In accordance with the present invention, as described in the foregoing, an emergency cutoff valve is provided at a mirror chamber side which is upstream of or in front of a beryllium window provided on the exposure apparatus side. This can avoid any differential pressure applied to the beryllium window at the time of occurrence of emergency leakage. Therefore, it is possible to prevent damage of the beryllium window as well as the contamination of the main chamber of the exposure apparatus due to pieces of the broken beryllium film.

Further, all the mirror port controls as well as all the exposure apparatuses are connected by means of one or more communication lines. With this arrangement, if leakage is detected in respect to one port, substantially at the same time all the emergency cutoff valves of all the ports can be closed. Therefore, it is possible to avoid the possibility of damage or otherwise of all the exposure apparatuses.

In another aspect, in regard to any error in the positional relationship between the SOR ring, mirror port and exposure apparatus, an abnormality signal from a seismometer is communicated to all the exposure apparatuses by way of a communication line, in response to which the exposure operations in these apparatuses are stopped. Therefore, it is possible to suppress formation of defect shots to a minimum.

While the invention has been described with reference to the structures disclosed herein, it is not confined to the details set forth and this application is intended to cover such modifications or changes as may come within the purposes of the improvements or the scope of the following claims.

What is claimed is:

1. An exposure system, comprising:
   a SOR ring;
   a plurality of exposure units each being related to said SOR ring and each being arranged to expose a workpiece with radiation from said SOR ring; and
   a communication cable for connecting said exposure units and being serviceable to signal an exposure unit of an operating state of another exposure unit.

2. A system according to claim 1, wherein each of said exposure units includes an exposure apparatus, a port device for introducing the radiation from said SOR ring to said exposure apparatus and a control for controlling at least one of said exposure apparatus and said port device.

3. A system according to claim 2, wherein each exposure unit further includes a vacuum gauge for measuring the degree of vacuum related to at least one of said exposure apparatus and said port device and wherein said control of each exposure unit is operable to transmit an abnormality signal to another control of another exposure unit through said communication cable, when any leakage is detected by said vacuum gauge.

4. A system according to claim 3, wherein each exposure unit further includes a cutoff valve which is disposed between said exposure apparatus and said port device or between said port device and said SOR ring, and wherein said control is operable to close said cutoff valve in response to reception of an abnormality signal from another control of another exposure unit through said communication cable.

5. An exposure system, comprising:
   a SOR ring;
   an exposure unit related to said SOR ring and being arranged to expose a workpiece with radiation from said SOR ring;
   a seismometer unit; and
   a communication cable for connecting said exposure unit and said seismometer unit, said communication cable being serviceable, when an earthquake is detected by said seismometer unit, to transmit an abnormality detection signal to said exposure unit.

6. A system according to claim 5, wherein in response to reception of the abnormality detection signal, said exposure unit stops its exposure operation.

7. An exposure unit usable in an exposure system having a SOR ring, comprising:
   an exposure apparatus arranged to expose a workpiece with radiation from the SOR ring;
   shock wave delay means disposed in a passageway for introducing the radiation from the SOR ring to said exposure apparatus;
   a first emergency cutoff valve for closing said passageway between the SOR ring and said shock wave delay means;
   a second emergency cutoff valve for closing said passageway between said exposure apparatus and said shock wave delay means; and
   control means for controlling said first and second emergency cutoff valves to close said first emergency cutoff valve when leakage occurs at a side of said shock wave delay means closer to said exposure apparatus and to close said second emergency cutoff valve when leakage occurs at the other side of said shock wave delay means closer to the SOR ring.

8. An exposure unit according to claim 7, wherein said control means includes first and second vacuum gauges for sensing vacuum levels at the exposure apparatus side and the SOR ring side of said shock wave delay means, respectively, to detect any leakage thereat.

9. An exposure unit usable in an exposure system having a SOR ring, comprising:
   an exposure apparatus for exposing a workpiece with radiation from the SOR ring;
   passageway defining means for coupling the SOR ring and said exposure apparatus and for introducing the radiation from the SOR ring to said exposure apparatus;
   first leakage sensing means for sensing leaking from the exposure apparatus side of the exposure unit;
   second leakage sensing means for sensing leaking from the SOR ring side of the exposure unit;
   protecting means having first and second emergency cutoff valves, said protecting means being responsive to the sensing by said first leakage sensing means to block said passageway defining means by said first emergency cutoff valve so as to protect the SOR ring against the leakage sensed by said first leakage sensing means, said protecting means further being responsive to the sensing by said second leakage sensing means to block said passageway defining means by said second emergency cutoff valve so as to protect said exposure apparatus against the leakage sensed by said second leakage sensing means.

10. An exposure unit according to claim 9, wherein said protecting means includes a common shock wave delay tube disposed between said first and second emergency cutoff valves.

* * * * *

UNITED STATES PATENT AND TRADEMARK OFFICE
CERTIFICATE OF CORRECTION

PATENT NO. : 5,001,734

DATED : March 19, 1991

INVENTOR(S) : Koji Uda, et al.

It is certified that error appears in the above-identified patent and that said Letters Patent is hereby corrected as shown below:

ON THE COVER PAGE

IN FOREIGN PATENT DOCUMENTS

"1088400    4/1989    Japan" should read
--1-088400  4/1989    Japan--.

COLUMN 2

Line 1, "damages" should read --damage--.

COLUMN 3

Line 38, "netic" should read --nets--; and
Line 40, "the" should read --that--.

COLUMN 8

Line 34, "unit;" should read --unit; and--.

Signed and Sealed this

Ninth Day of February, 1993

Attest:

STEPHEN G. KUNIN

Attesting Officer

Acting Commissioner of Patents and Trademarks